(12) United States Patent
Ngo et al.

(10) Patent No.: US 7,323,418 B1
(45) Date of Patent: *Jan. 29, 2008

(54) ETCH-BACK PROCESS FOR CAPPING A POLYMER MEMORY DEVICE

(75) Inventors: Minh Van Ngo, Fremont, CA (US); Angela T. Hui, Fremont, CA (US); Sergey D. Lopatin, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 51 days.

This patent is subject to a terminal disclaimer.

(21) Appl. No.: 11/102,004

(22) Filed: Apr. 8, 2005

(51) Int. Cl.
*H01L 21/302* (2006.01)

(52) U.S. Cl. .................. 438/708; 438/709; 438/721; 438/722; 438/743

(58) Field of Classification Search .............. 438/708, 438/709, 721, 722, 743
See application file for complete search history.

(56) References Cited

U.S. PATENT DOCUMENTS

| | | | |
|---|---|---|---|
| 6,344,412 B1 * | 2/2002 | Ichikawa et al. | ............ 438/661 |
| 6,756,620 B2 * | 6/2004 | Li et al. | ...................... 257/295 |
| 6,787,458 B1 * | 9/2004 | Tripsas et al. | .............. 438/652 |
| 7,129,133 B1 * | 10/2006 | Avanzino et al. | ........... 438/244 |
| 2005/0227382 A1 * | 10/2005 | Hui | .............................. 438/14 |

* cited by examiner

*Primary Examiner*—Binh X. Tran
(74) *Attorney, Agent, or Firm*—Amin, Turocy & Calvin, LLP

(57) ABSTRACT

The present invention leverages an etch-back process to provide an electrode cap for a polymer memory element. This allows the polymer memory element to be formed within a via embedded in layers formed on a substrate. By utilizing the etch-back process, the present invention provides tiny electrical contacts necessary for the proper functioning of polymer memory devices that utilize the vias. In one instance of the present invention, one or more via openings are formed in a dielectric layer to expose an underlying layer. A polymer layer is then formed within the via on the underlying layer with a top electrode material layer deposited over the polymer layer, filling the remaining portion of the via. Excess portions of the top electrode material are then removed by an etching process to form an electrode cap that provides an electrical contact point for the polymer memory element.

17 Claims, 11 Drawing Sheets

US 7,323,418 B1

ETCH-BACK PROCESS FOR CAPPING A POLYMER MEMORY DEVICE

TECHNICAL FIELD

The present invention generally relates to processing a semiconductor substrate. In particular, the present invention relates to a polymer memory device and a method of manufacturing the polymer memory device.

BACKGROUND ART

The volume, use and complexity of computers and other electronic devices are persistently increasing. As computers continually become more powerful, new and improved electronic devices are continuously developed (e.g., digital audio players, video players). Additionally, the growth and use of digital media (e.g., digital audio, video, images, and the like) have further pushed development of these devices. This growth and development has vastly increased the amount of information desired/required to be stored and maintained for computer and electronic devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid-state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances, which are much smaller than the small minimum size, for example, one quarter the minimum size.

Scaling inorganic solid-state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Furthermore, applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage for inorganic non-volatile memory devices while meeting increased performance demands is particularly difficult, especially while maintaining low costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates generally to processing semiconductor substrates, and more particularly to systems and methods for fabricating a memory device. An etch-back process is leveraged to provide an electrode cap for a polymer memory element. This allows the polymer memory element to be formed within a via embedded in layers formed on a substrate. By utilizing the etch-back process, the present invention provides an efficient and cost effect method of forming the tiny electrodes necessary for the proper functioning of polymer memory cells that utilize the vias. In one instance of the present invention, copper contacts and/or bit lines are formed within a metal-containing layer. One or more via openings are then formed in an overlying dielectric layer to expose one or more of the copper contacts and/or bit lines. A portion of the exposed copper is then converted to copper sulfide (e.g., $Cu_2S_2$ or $Cu_2S$), which can act as a catalyst to facilitate selective polymer growth by way of chemical vapor deposition (CVD). A spin-on diluted polymer solution, for example, can then be employed such that the solution is baked in order to fill at least a bottom portion of the via. A top electrode material layer can then be deposited over the memory structure in order to fill the remaining portion of the via. Excess and/or unwanted portions of the top electrode material are then removed by an etching process to form an electrode cap that is adjacent to the polymer material, the electrode cap providing an electrical contact point for the polymer memory element.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

Figure 1:
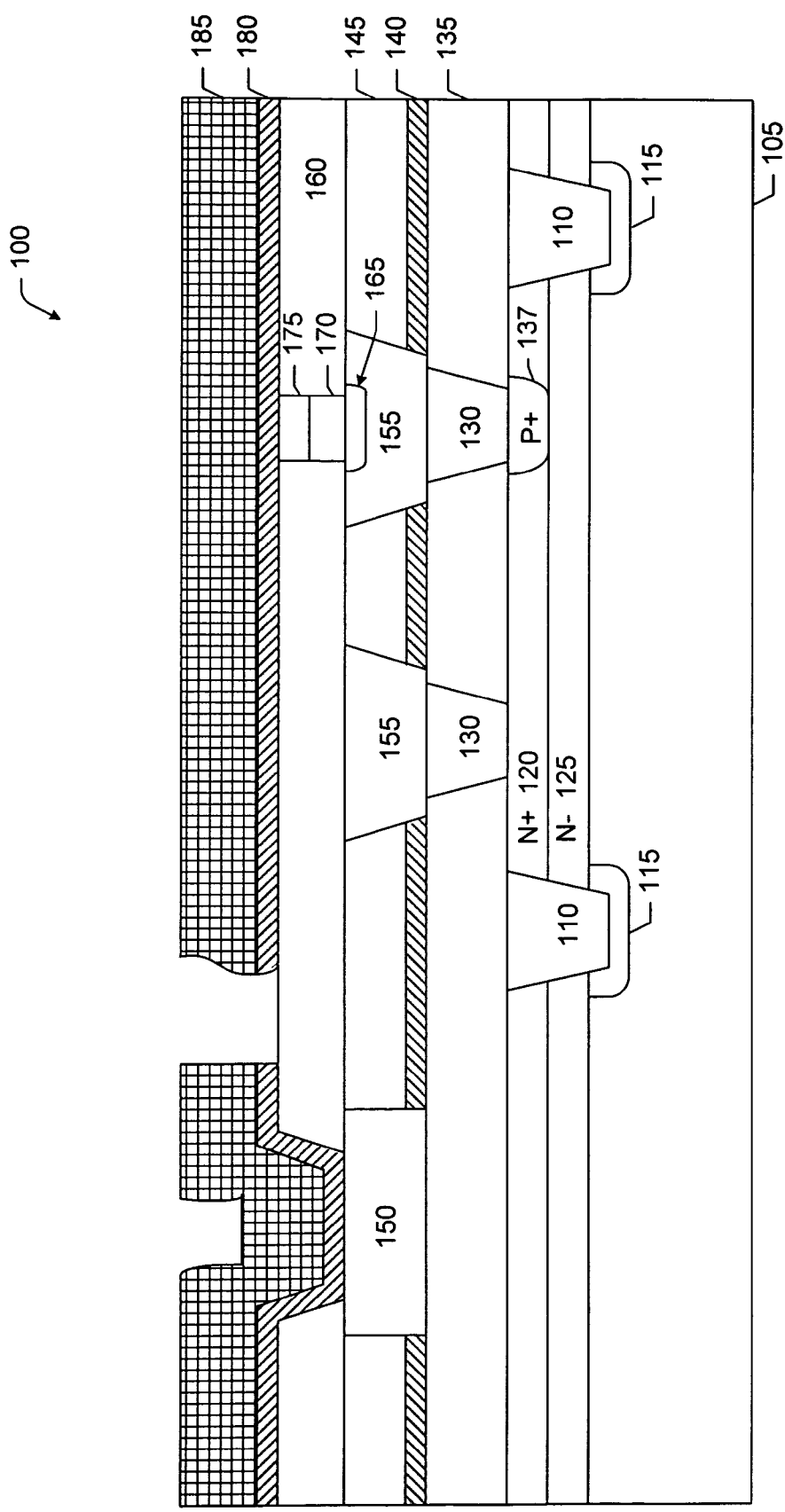
FIG. 1 illustrates a cross-sectional view of an exemplary polymer memory device formed in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The present invention involves systems and methods for manufacturing a polymer memory device within a via formed within an insulating layer. The methods include forming a copper bit line and/or copper pad, exposing at least a portion of the copper (e.g. from the bit line and/or pad) in order to convert it to a catalytic material. Thus at least a portion of the catalytic material can be partially embedded within an upper portion of the copper bit line and/or pad (e.g., adjacent to an electrode). Furthermore, at least a portion of the catalytic material contacts a portion of a polymer memory device such that the catalytic material forms a lower portion of the polymer memory device. This arrangement of the catalytic material facilitates access between at least one electrode and the polymer memory element.

Moreover, the catalytic material constitutes a passive region and comprises at least one material that facilitates conductivity. One example of catalytic material is copper sulfide. Other materials and/or compounds may also be employed depending on the configuration and type of structure desired. Examples include copper oxide and silver-copper-sulfide complex. Still other examples exist but are not list for the sake of brevity.

Because the via formed in the overlying insulating layer exposes at least a portion of the passive region, the passive region can be used to facilitate polymer growth and/or formation in at least the lower portion of the via. Examples of programmable polymers which may be grown and/or formed and employed in the present invention include polyphenol acetylene, poly-acetylene, poly-diphenyl acetylene, polyaniline, polythiophene, polyporphyrins, porphyrinic macrocycles, thiol derivatized polyporphyrins, polymetallocenes, polyferrocenes, polyphthalocyanines, polyvinylenes, polypyrroles, and poly-(p-phenylene vinylene, and/or combinations thereof, and/or monomers thereof.

Polymer growth and/or formation in the via may be terminated before the via is substantially filled with polymer material. The remaining or upper portion of the via can be filled with a top electrode material such as any suitable conductive material. For example, the top electrode material may be any one of tungsten, titanium, tantalum, titanium nitride, tantalum nitride, amorphous carbon, aluminum, indium-tin oxide, platinum, zinc, nickel, iron, manganese, magnesium, gold, chromium, metal silicides, alloys thereof, and/or any combination thereof. Exemplary alloys can be Hastelloy®, Kovar®, Invar, Monel®, Inconel®, brass, stainless steel, magnesium-silver alloy, and various other alloys.

Thereafter, an aluminum-containing word line may be formed over the via to substantially complete fabrication of the memory cell device. The word line may be at least partially composed of materials such as aluminum and/or other substances depending on the desired application.

The polymer memory device may be programmed by applying a voltage across the electrode material to establish impedance within the polymer memory device. The impedance represents one or more bits of information that is retained within the memory device. For example, after storing one or more bits of information, the voltage can be removed and the information remains stored within the polymer memory device. In addition, the polymer memory device does not require a refresh voltage to maintain the stored information.

To retrieve information stored within a polymer memory device, a current can be applied and following, the impedance stored in the memory device can be measured. Similar to programmed information, retrieved information from a memory element relates to one or more bits of information. The polymer memory device can have two states: a conductive "on" state or a non-conductive "off" state. In addition to these two states, polymer memory devices are capable of maintaining multiple states contrary to conventional memory devices. More specifically, the polymer memory device can employ varying degrees of conductivity to identify additional states. For instance, the polymer memory device can exhibit a low impedance state including a very highly conductive state (e.g., very low impedance state), a highly conductive state (e.g., low impedance state), a conductive state (e.g., medium level impedance state), and a non-conductive state (e.g., very high impedance). Thus, multiple bits of information can be stored in a single polymer memory cell (e.g., 2 or more bits of information—4 states providing 2 bits of information, 8 states providing 3 bits of information, etc.).

The fabrication methods include forming a polymeric semiconductor as a layer and/or within a via in a layer and subsequently utilizing lithography techniques to form the polymer memory device. The fabrication methods can be employed to form one or more polymer memory devices serially and/or concurrently.

Fabrication of the polymer memory device in accordance with the present invention will now be described with respect to FIGS. 1-11 below.

FIG. 1 illustrates a memory cell structure 100 which has been formed in substantial part in accordance with an aspect of the present invention. The memory cell structure initially comprises a substrate layer 105, one or more shallow trench isolation regions 110 under which channel stop implanted regions are formed 115. The STI regions 110 may be filled with an oxide material, for example. Adjacent the STI regions 110 are areas which have been implanted with $N^+$ 120 and $N^-$ 125 to facilitate operation of the memory cell structure 100.

The memory cell structure 100 also comprises one or more tungsten plugs 130 which are formed within an interlayer dielectric layer 135. A $P^+$ implant region 137 may be formed underlying one or more of the tungsten plugs 130 in order to facilitate the operation of the memory cell structure 100. The interlayer dielectric (ILD) layer 135 may comprise any suitable insulating material desired by a user. Overlying the ILD layer 135 may be a stop layer 140 followed by a first metal oxide layer 145. One or more copper (Cu) contacts are formed through the first metal oxide layer 145 and the stop layer 140. As shown, a copper connection contact 150 can be formed. Other contacts such as one or more Cu bit line and/or pads 155 which are formed directly over the one or more tungsten plugs 130 are also fabricated.

Atop the copper contacts 150, 155, at least one dielectric layer 160 is deposited and etched in order to create one or more via openings therein. The via opening is created in order to expose at least a portion of copper. The exposed copper is converted to a catalytic material 165 just below or at the base of the via opening and is utilized to facilitate polymer growth to thus form a polymer memory element (ME) 170 in a lower portion of the via opening. Thus, the catalytic material operates as a passive layer or region to facilitate access between at least one electrode and the polymer memory element 170.

The upper portion of the via opening includes a top electrode (TE) conductive material 175. The TE conductive material may comprise any number of materials such as tungsten, titanium, titanium nitride, tantalum, tantalum nitride, amorphous carbon, and/or any combinations thereof. When a suitable voltage is applied between a bottom or lower electrode (copper contact 155) and a top electrode 175, information can be written, read, and/or erased from the polymer memory element 170. Moreover, though only a single polymer memory element 170 is depicted as being constructed in FIG. 1, it should be understood that multiple polymer memory elements may be built in the manner described herein.

Finally, a barrier metal layer 180 and a word line 185, respectively, are present over at least a portion of the top-electrode 175 and at least a portion of the dielectric layer 160. The barrier metal layer 180 may be composed of a tantalum material, for example. Other materials such as cobalt, chromium, nickel, palladium, titanium, tantalum silicon nitride, silicon nitride, titanium nitride, tantalum nitride, tungsten nitride, and/or combinations thereof may also be utilized in the composition of the barrier metal layer 180. The barrier metal layer 180 serves to mitigate diffusion from conductive layers to other layers. The word line may comprise aluminum and is formed a top the barrier metal layer 180. Alternative materials may be employed for both the barrier metal layer and the word line as desired or appropriate for the particular structure and application.

Although no other features are demonstrated in the memory cell structure 100, it should be appreciated that other features may be formed and presented in the memory cell structure 100 and such is contemplated to fall within the scope of the present invention.

Fabrication of the memory cell structure 100 and the polymer memory device in particular, are described in substantial part below in FIGS. 2-11.

Figure 2:
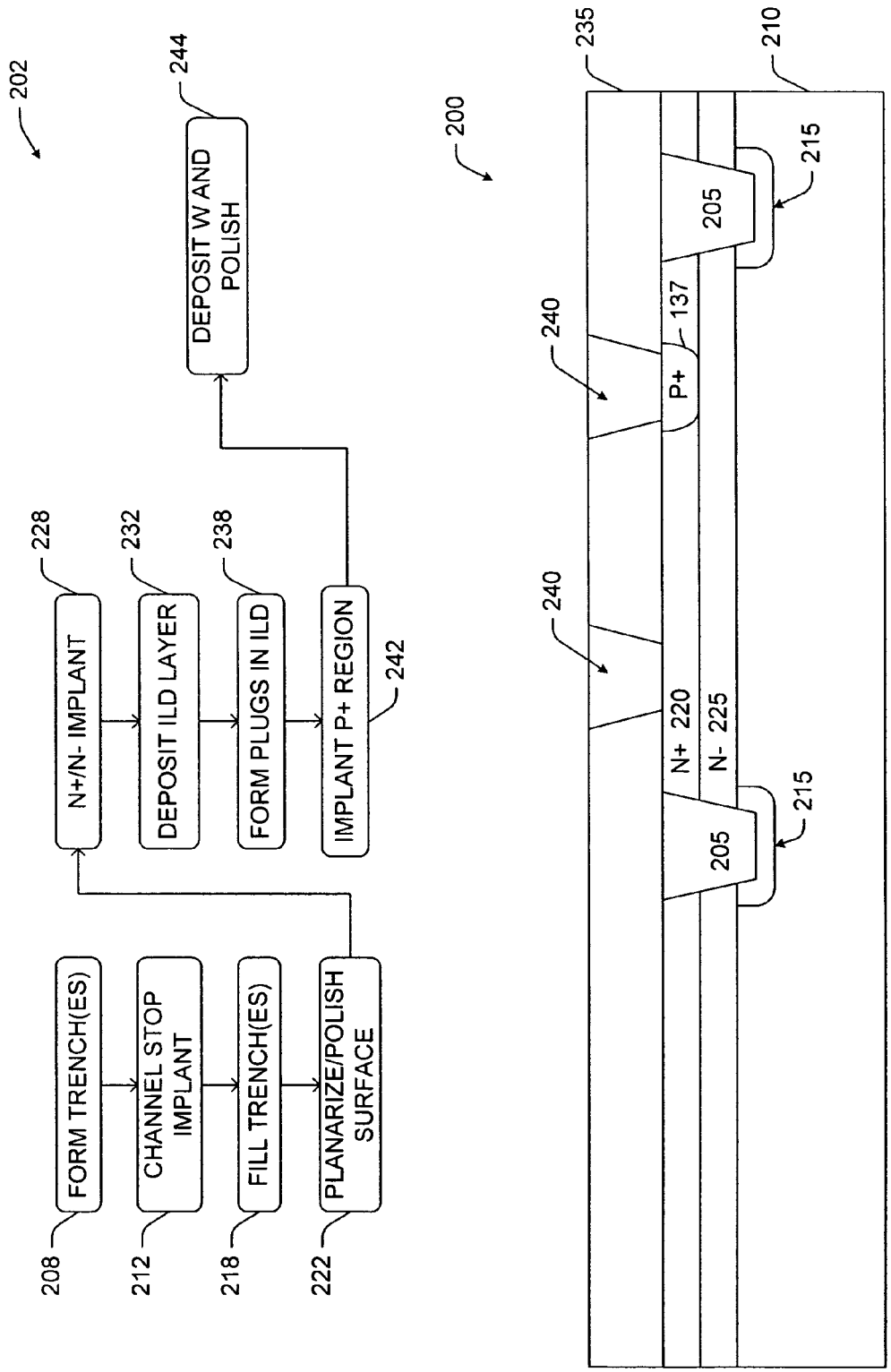
FIG. 2 illustrates a cross-sectional view of a schematic memory structure which has been partially fabricated in accordance with an aspect of the present invention.

In FIG. 2, exemplary base elements of a memory cell structure 200 are depicted coincident with a diagram 202 representing a portion of a process for forming such base elements according to an aspect of the present invention. For instance, at least one shallow trench isolation (STI) 205 may be formed in a substrate layer 210 such as by etching at least one trench (at 208) therein using a suitable mask to create a desired trench pattern. Following STI 205 formation, a channel stop implant may be performed (at 212) through the trench(es) in order to form channel stop regions 215 in the area(s) immediately surrounding the bottom portion of the STI(s) 205.

The STI(s) 205 may then be filled with an oxide material (at 218) whereby the STI(s) 205 are thereafter polished and any excess oxide material is stripped to leave oxide material within the STI regions 205. Alternatively or in addition, the surface of the memory structure formed thus far may undergo a planarization process (at 222) that employs a reverse planarization mask (not shown) in order to facilitate formation of the desired features.

An implant of $N^+$ (220) and $N^-$ (225) can then be performed (at 228) in order to create an appearance of two layers 230 of materials adjacent the STI regions 110. Following, an interlayer dielectric (ILD) layer 235 may be deposited (at 232) over the STI regions 205 as well as over the $N^+$ region 220. Using a first contact mask, one or more plugs 240 can be etched therein (at 238). At 242, a $P^+$ implant can be performed through at least one of the etched plugs 240 to form the $P^+$ region (FIG. 1, 137). Following, the plugs 240 can be filled with tungsten material, for example, and any excess tungsten present outside of the plugs 240 may be removed using a suitable polishing process such as a CMP process (at 244).

Figure 3:
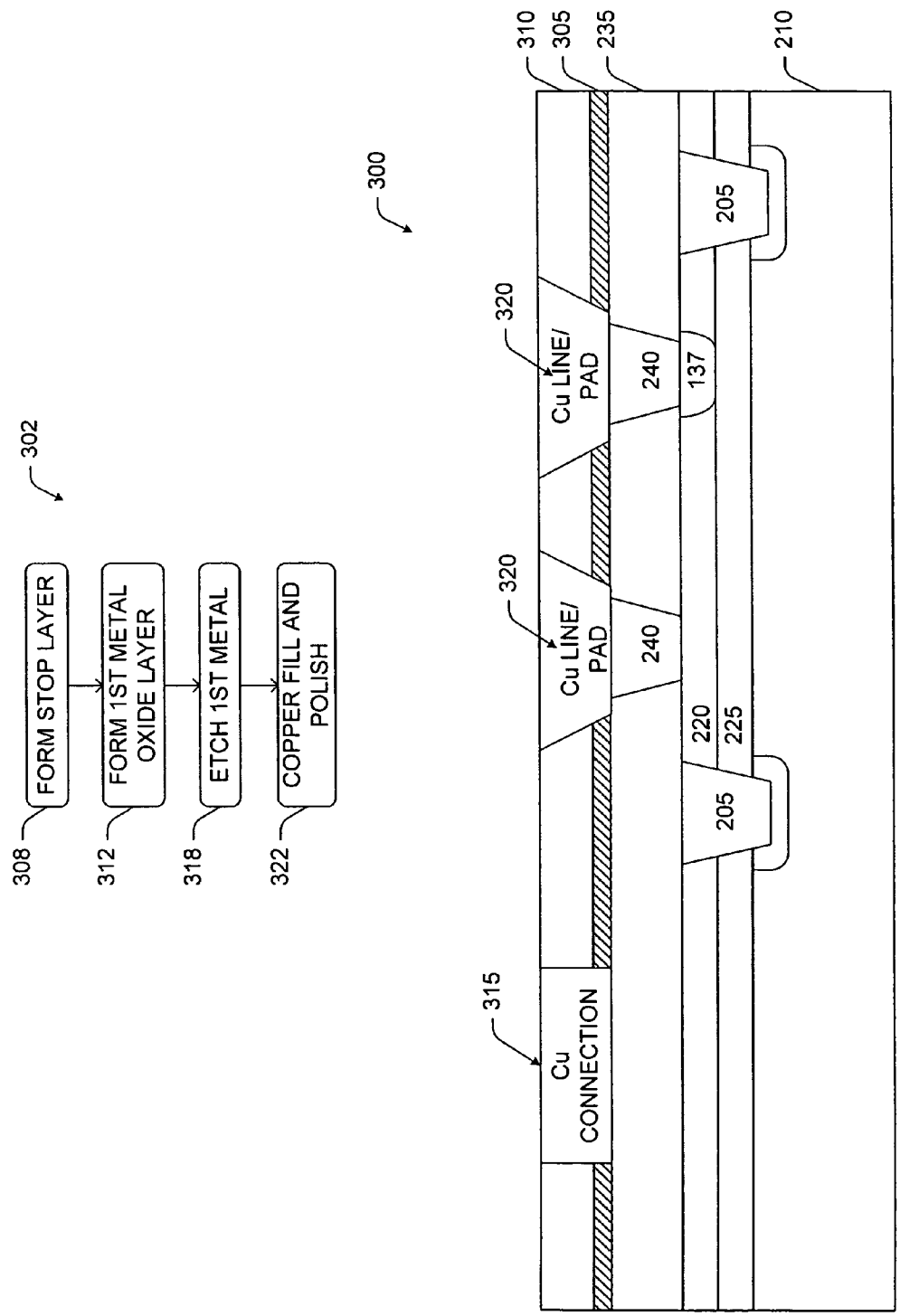
FIG. 3 illustrates a cross-sectional view of a schematic memory structure which has been partially fabricated in accordance with an aspect of the present invention.

FIG. 3 demonstrates a cross-sectional view of a partially fabricated memory cell structure 300 coincident with a diagram 302 representing a portion of a process employed in accordance with an aspect of the present invention. The memory cell structure 300 is shown comprising a stop layer 305 which has been deposited (at 308) overlying at least a partial length of the memory cell structure 300. A first metal oxide layer 310 can then be formed (at 312) over the stop layer 305 using any suitable deposition technique.

Following, one or more copper contacts 315 may be formed through at least a portion of the metal oxide layer 310 and the corresponding, underlying portion of the stop layer 305. In particular, the metal oxide layer 310 is etched (at 318), for example, by employing a single or dual damascene process in order to form one or more copper bit lines 320 and/or one or more copper pads 320. One or more photoresists can be employed to properly and sufficiently form the copper bit lines 320 and/or copper pads 320. Though not shown in FIG. 3, it should be appreciated that the copper bit lines and/or copper pads may include a barrier layer conformal to the sidewalls and/or bottom portion of the unfilled (bit line/pad) opening(s). Subsequently, the bit lines and/or pads are filled with copper and/or a copper-containing material 322. Excess copper can be removed by a polishing process in order to yield a substantially planar surface.

Figure 4:
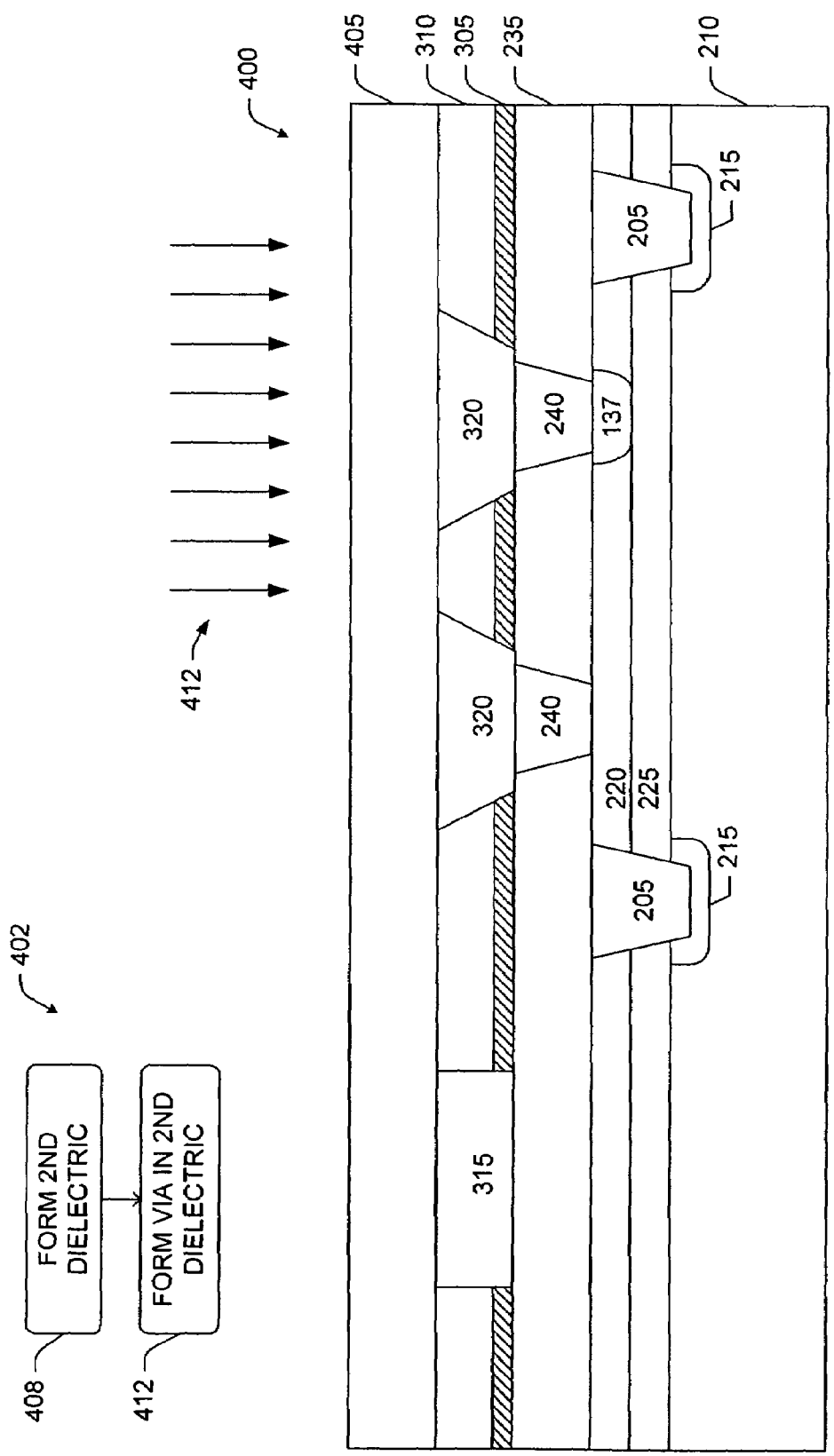
FIG. 4 illustrates a cross-sectional view of a schematic memory structure which has been partially fabricated in accordance with an aspect of the present invention.

In FIG. 4, a schematic illustration of a partially formed memory cell structure 400 coincident with a diagram 402 representing a portion of a process for making the memory cell structure is depicted in accordance with an aspect of the present invention. Once the copper bit lines/pads 320 have been fabricated, one or more dielectric layers 405 may be formed (at 408) thereover as shown in FIG. 4. Suitable dielectric materials include oxide, nitride, TEOS, FTEOS, organic materials, and/or any combination thereof. Using a suitable etching process and an appropriate patterned photoresist applied thereon, one or more via openings may be formed selectively in at least one portion of the dielectric layer 405 as indicated at 412.

Figure 5:
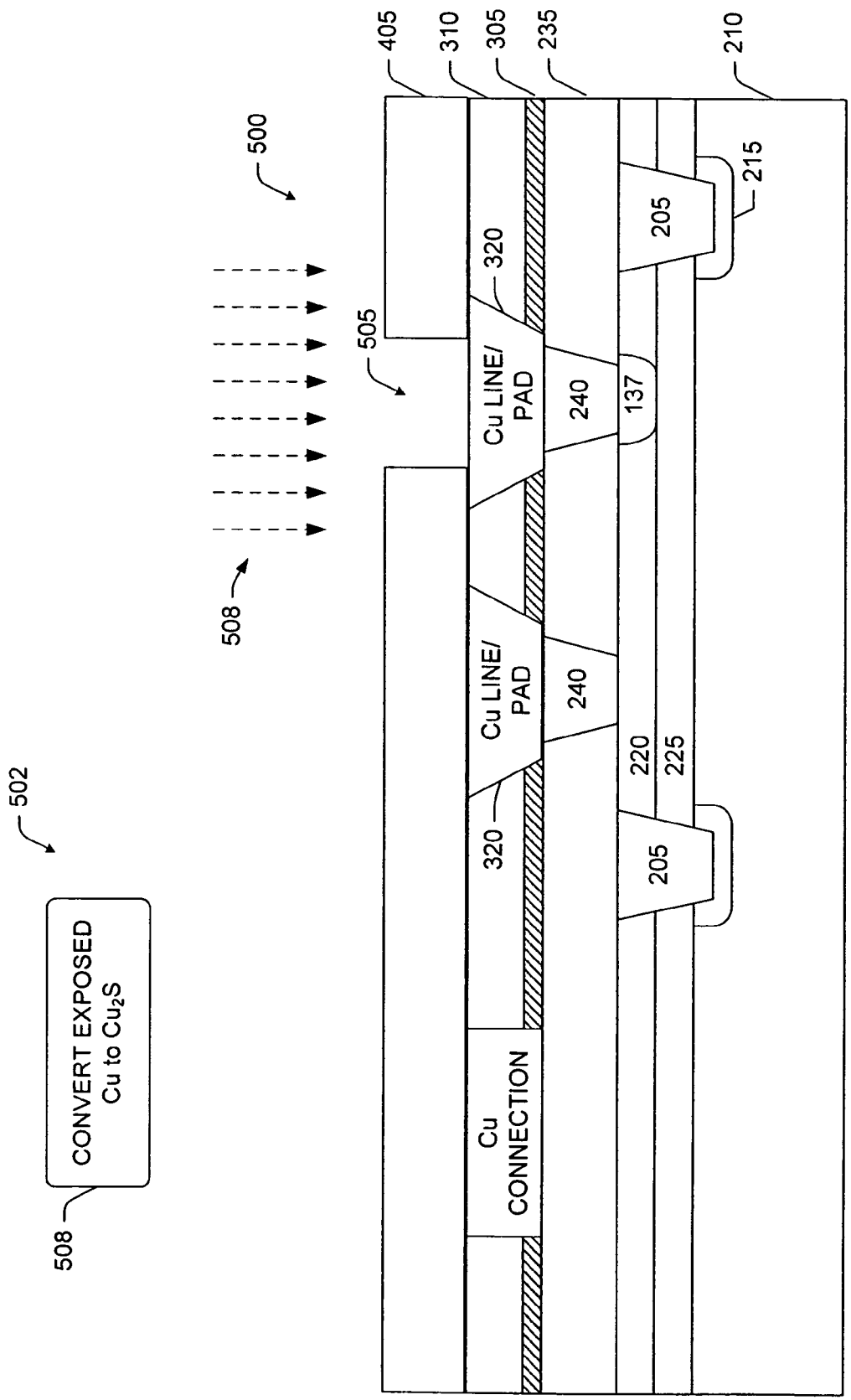
FIG. 5 illustrates a cross-sectional view of a schematic memory structure which has been partially fabricated in accordance with an aspect of the present invention.

FIG. 5 represents a resulting memory cell structure 500 coincident with a diagram 502 of a portion representing a portion of a process employed to fabricate a polymer memory device in accordance with an aspect of the present invention. The memory cell structure 500 demonstrates at least one via opening 505 formed in the dielectric layer 405 such that at least a portion of a copper bit line/pad 320 is exposed therethrough. The copper pad 320 may operate as a lower/bottom electrode of a polymer memory device structure. Though only one via opening is illustrated, it should be understood that more than one via opening may be created in the manner described above.

At least a portion of the exposed copper is then converted to copper sulfide (at 508) which acts as a catalyst in subsequent fabrication processes, such as to promote growth of a polymer memory element thereon. In addition, the copper sulfide also operates as a passive region that facilitates access between at least one electrode material and a polymer memory element. This enhances operation of the overall memory cell structure. It should be appreciated that other materials may be utilized in addition to the copper sulfide which may act as suitable catalysts to promote formation of the polymer memory element.

Figure 6:
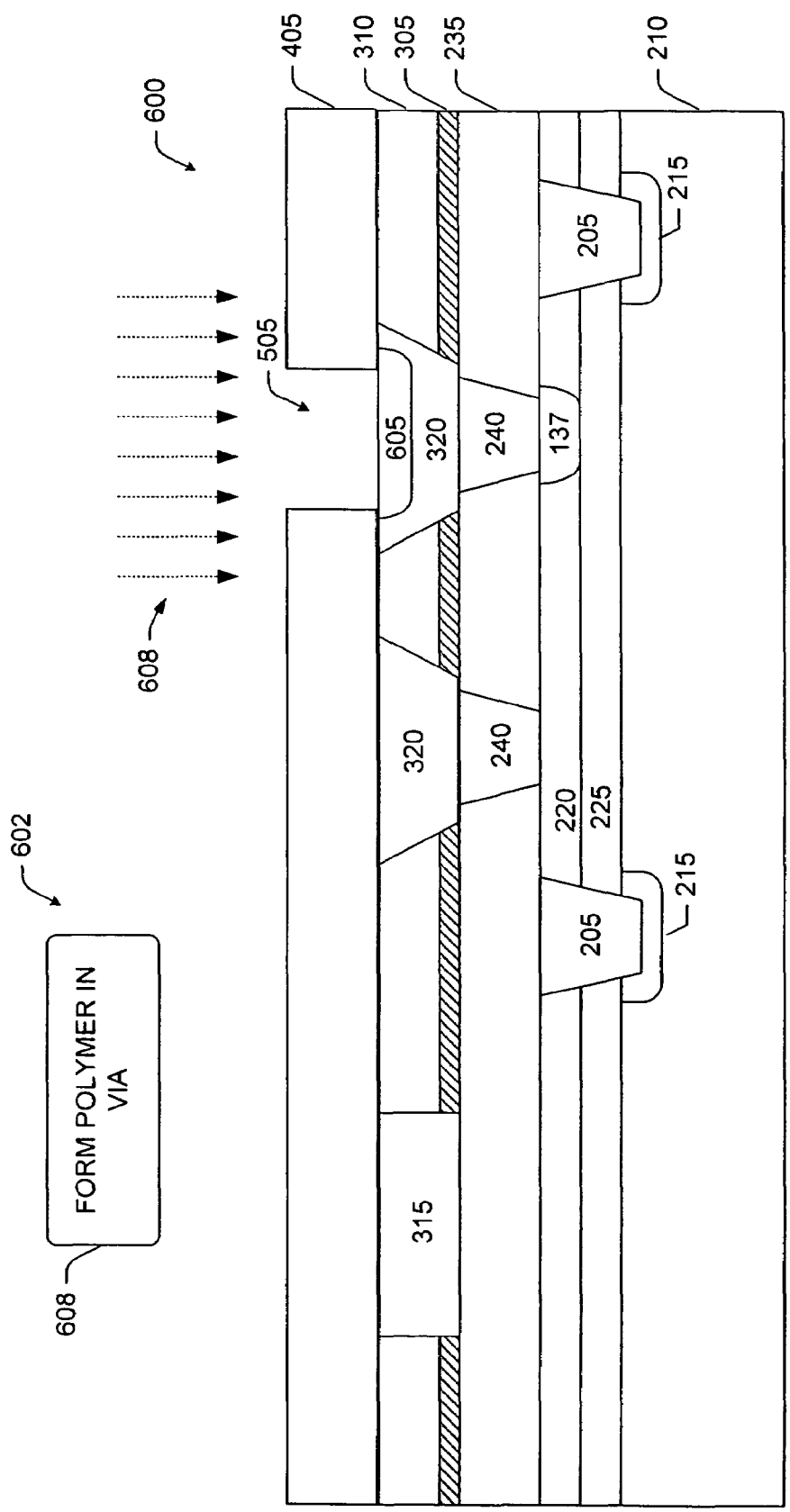
FIG. 6 illustrates a cross-sectional view of a schematic memory structure which has been partially fabricated in accordance with an aspect of the present invention.

In FIG. 6, a partially fabricated memory cell structure 600 is illustrated in accordance with an aspect of the present invention and coincident with a diagram 602 representing a portion of a process applied to the memory cell structure 600. The memory cell structure 600 is depicted as having an area of catalytic material (e.g. copper sulfide) 605 in the upper portion of the copper bit line/pad 320 and below a via opening 505. The copper sulfide has catalytic properties with respect to forming and/or growing polymer material. Thus, the copper sulfide 605 is employed to facilitate polymer growth (at 608) in at least a lower portion of the via opening 505.

Figure 7:
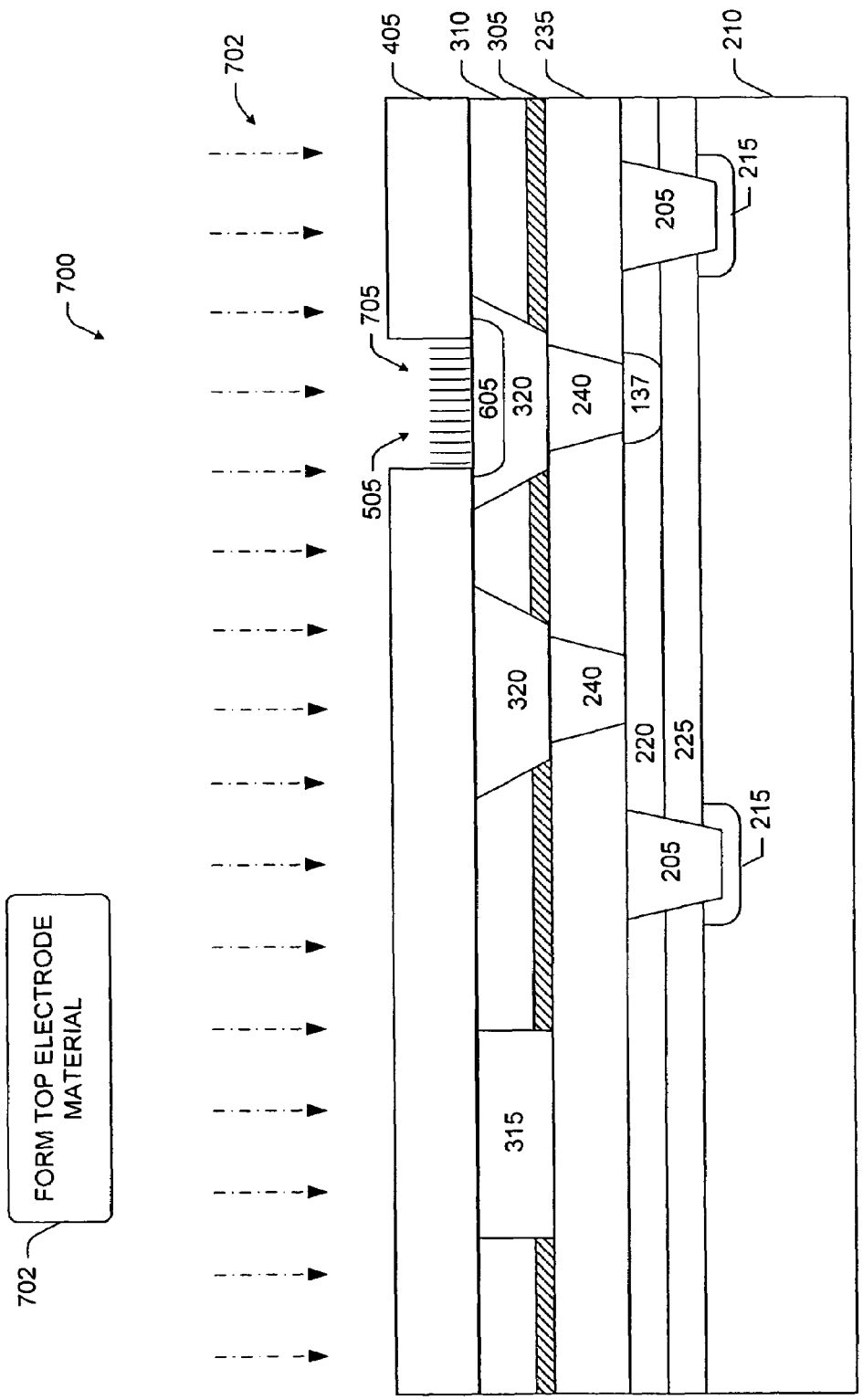
FIG. 7 illustrates a cross-sectional view of a schematic memory structure which has been partially fabricated in accordance with an aspect of the present invention.

FIG. 7 depicts a memory cell structure 700 resulting from FIG. 6 comprising a polymer material formed in the lower portion of the via opening 505. The polymer material constitutes a polymer memory element 705. The remaining portion of the via opening 505 is filled with a conductive material (at 702). The conductive material 702 constitutes a top electrode material. To be certain that the via opening is substantially filled with the conductive material, such conductive material may be deposited over a greater portion of the memory cell structure 700. This is further illustrated in FIG. 8.

Figure 8:
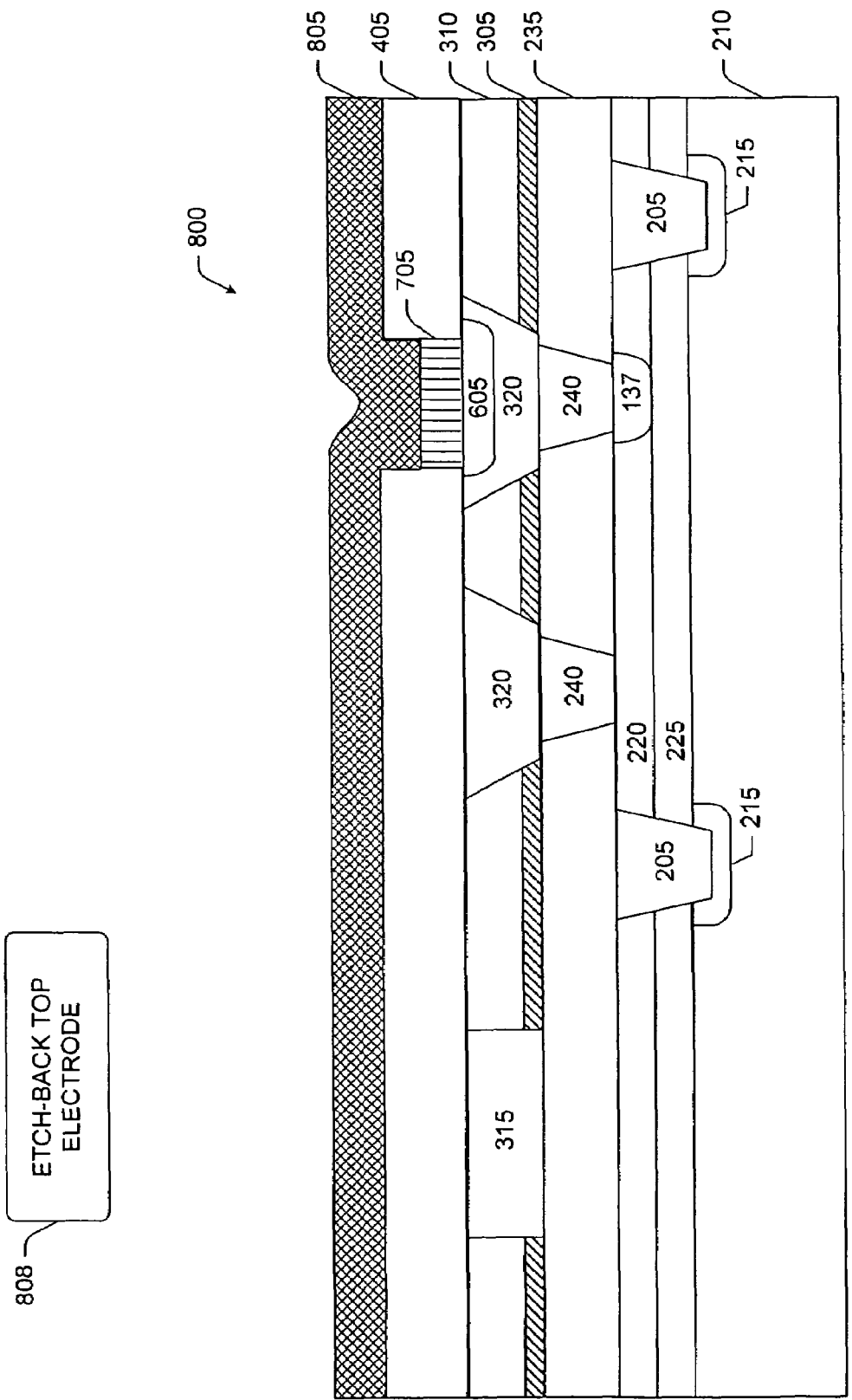
FIG. 8 illustrates a cross-sectional view of a schematic memory structure which has been partially fabricated in accordance with an aspect of the present invention.

FIG. 8 demonstrates a partially fabricated memory cell structure 800 comprising a top electrode layer 805 formed thereover. In order to remove excess top electrode material such that a top electrode plug is formed in the upper portion of the via 505, the top electrode layer is removed utilizing an etch-back process (at 808). Etching may be performed such that substantially all of the top electrode material is removed to expose the surface of the dielectric layer 405 without removing the top electrode material from the via 505. Thus, the etch-back processing is terminated at an appropriate time to allow the top electrode material to remain in the via 505.

Figure 9:
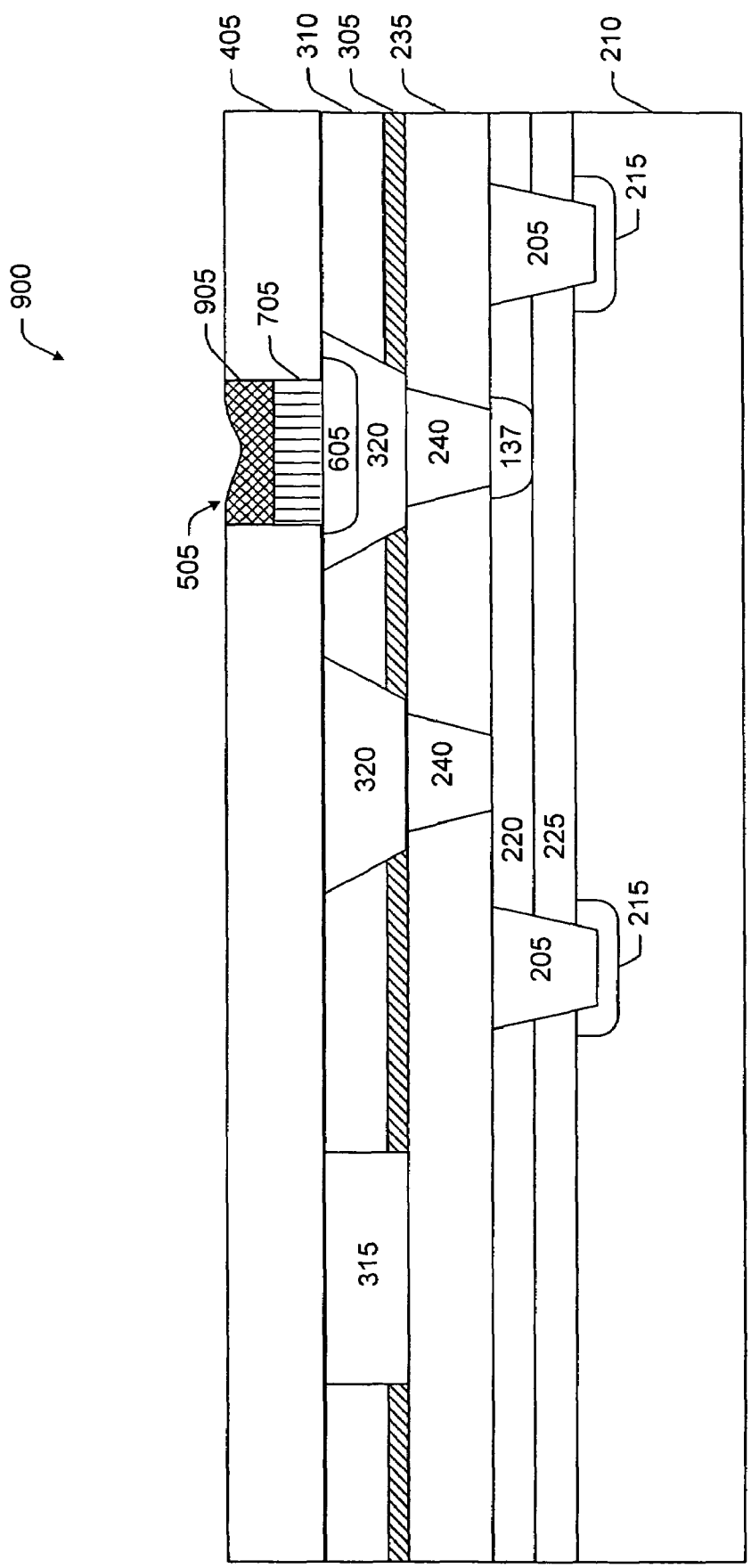
FIG. 9 illustrates a cross-sectional view of a schematic memory structure which has been partially fabricated in accordance with an aspect of the present invention.

FIG. 9 illustrates a memory cell structure 900 comprising a polymer memory element 705 formed within a via 505 and a top electrode plug 905 formed above the polymer memory element 705 in the via 505. Although not demonstrated in FIG. 9, the dielectric 405 may be etched through to form a contact with the copper contact 315. Accordingly, at least a portion of the copper contact 315 is exposed.

Figure 10:
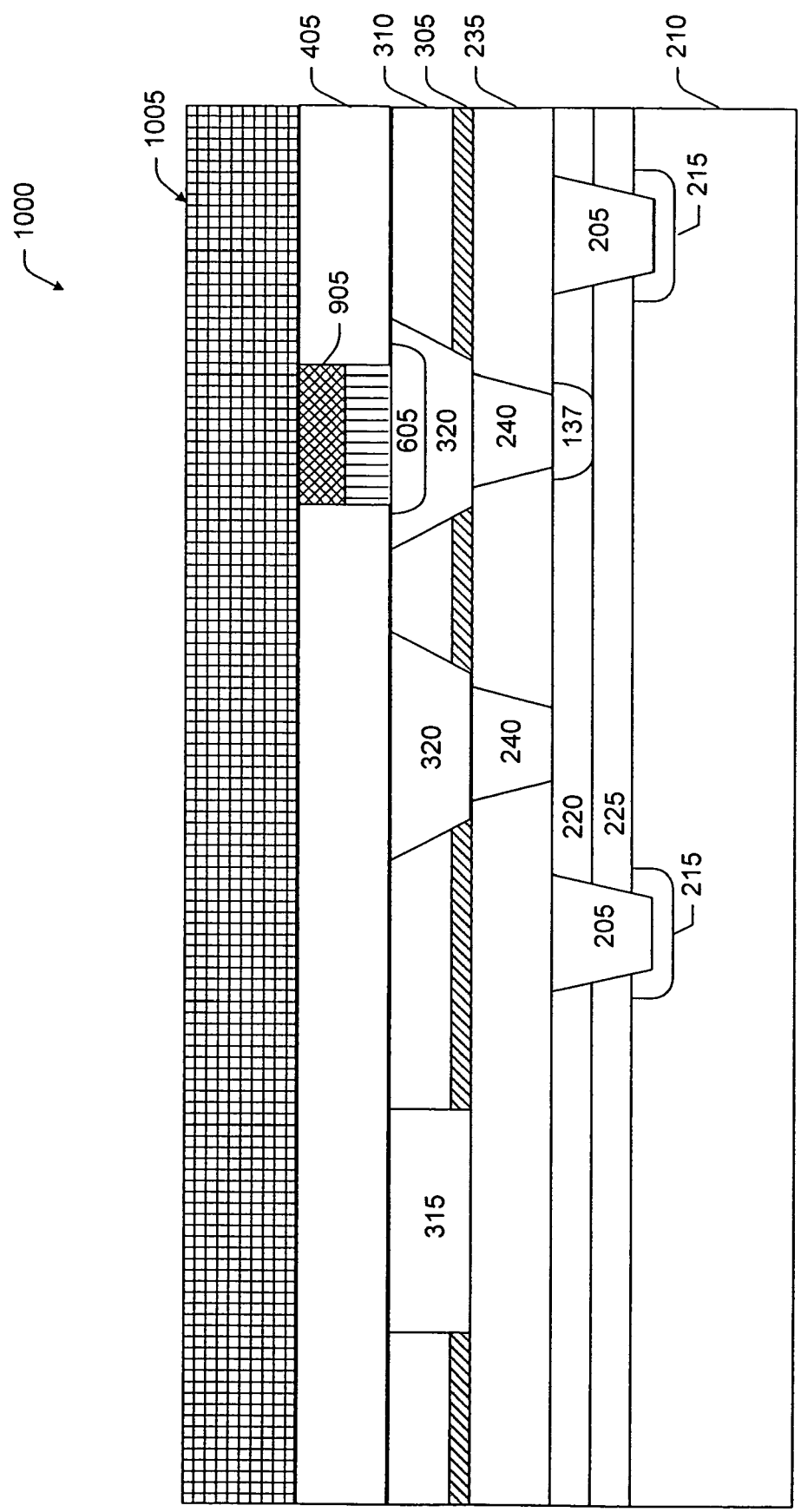
FIG. 10 illustrates a cross-sectional view of a schematic memory structure which has been substantially fabricated in accordance with an aspect of the present invention.

Turning to FIG. 10, a memory cell structure 1000 is shown comprising a word line 1005 which may be formed above the top electrode 905. Optionally, a barrier metal layer (not shown in FIG. 10; see FIG. 1) may be deposited between at least the top electrode cap and at least a portion of the word line 1005. The word line may comprise an aluminum-copper (0.5% copper) composition material deposited at a thickness of about 10,000 angstroms. When a portion of the dielectric layer 405 is etched to form an opening in the dielectric 405 to thus expose the copper contact 315, the barrier layer can be deposited thereover conformally. Further, the copper-containing aluminum word line layer 1005 may be deposited such that the opening in the dielectric 405 is also filled conformally (see FIG. 1). In addition, other features may be fabricated in and/or above the word line 1005 according to the desired application of the memory cell structure 1000.

Figure 11:
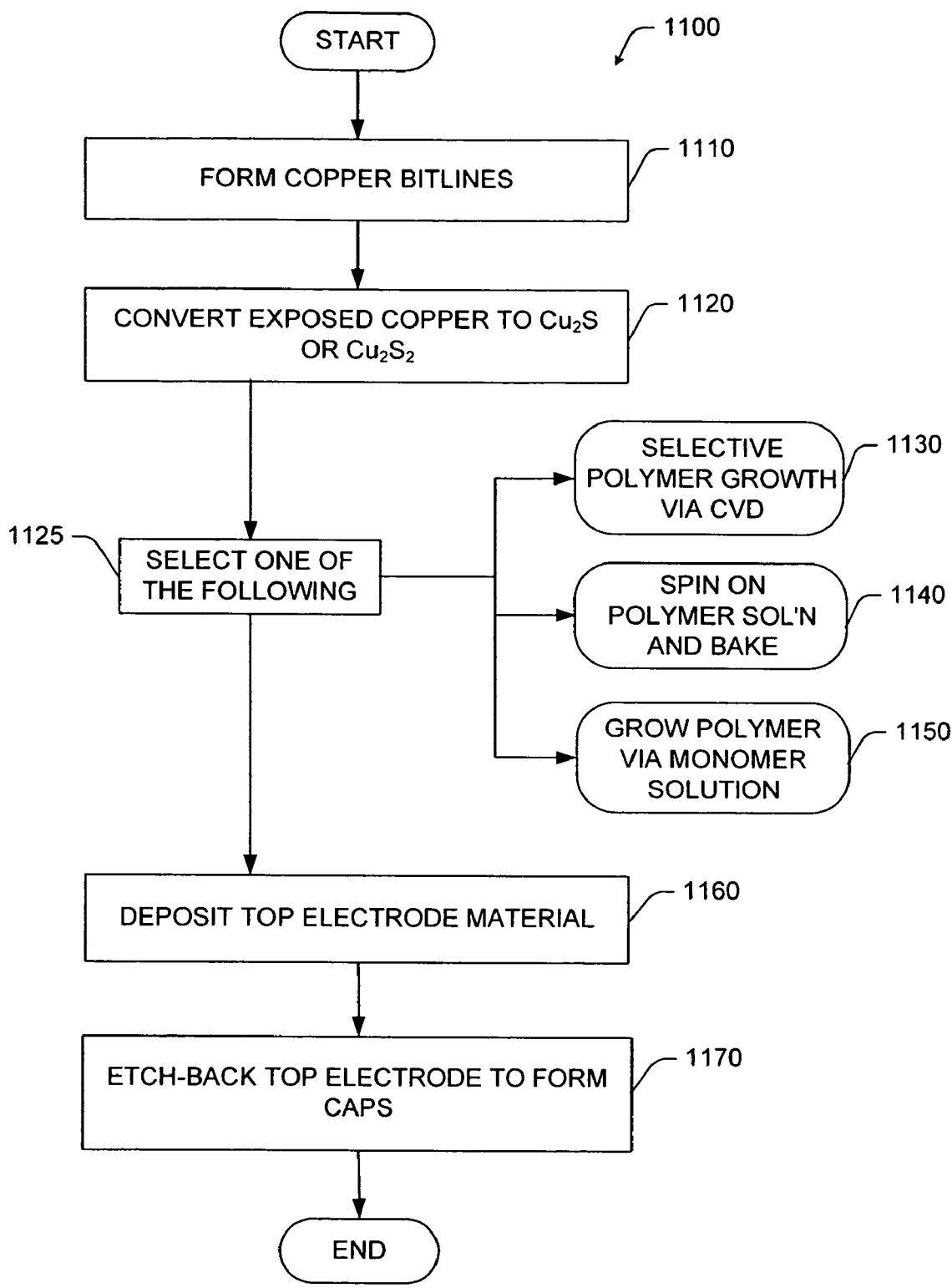
FIG. 11 illustrates a flow diagram of an exemplary method of forming a polymer memory device in a via in accordance with an aspect of the present invention.

Referring now to FIG. 11, a flow diagram of an exemplary method 1100 for fabricating a polymer memory device in a via is demonstrated in accordance with an aspect of the present invention. The method 1100 involves forming copper bit lines and/or copper pads within a metal-containing layer of material at 1110. The copper bit lines and/or copper pads may be formed by any one of a single and dual damascene process.

Next, exposed portions of copper are converted to copper sulfide at 1120. The copper sulfide serves at least as a catalyst in order to facilitate selective polymer growth in the via by chemical vapor deposition, for example. Alternatives to chemical vapor deposition include spin-on diluted polymer solution and/or utilizing a monomer solution. Thus, a user can select to use selective polymer growth via chemical vapor deposition at 1130, to spin on a polymer solution and bake to fill the lower portion of the via with polymer material at 1140, or to grow the polymer material in the lower portion of the via using a solution of monomers at 1150.

After the selection is made and polymer material is formed in the lower portion of the via, a top electrode material may be deposited in a blanket-like manner at 1160 in order form top electrode caps at 1170 in the upper portion of the via. Excess amounts of the top electrode material are removed by etching back the material back such that it only remains as caps or "plugs" in the upper portion of the via.

Though not explicitly described, it should be appreciated that multiple polymer memory devices in a plurality of vias may be formed in a memory cell structure. Furthermore, such via formation may be selective and accomplished in part by using one or more masks suitable to create the desired via pattern.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of fabricating a polymer memory device, comprising:
   providing a semiconductor substrate having at least one metal-containing layer thereon;
   depositing at least one dielectric layer over the metal-containing layer;
   forming at least one via in the dielectric layer to expose at least a portion of a copper bit line and/or a copper pad which are formed within a metal-containing layer;
   depositing a polymer material in a lower portion of the via;
   forming a top electrode material layer on the dielectric layer and the polymer material; and
   etching the top electrode material layer to form an electrode cap on the polymer material in the via.

2. The method of claim 1, wherein the metal-containing layer is formed by a damascene process.

3. The method of claim 1, the dielectric layer comprising at least one selected from the group consisting of oxide, nitride, TEOS, FTEOS, and organic materials.

4. The method claim 1 further comprising:
   forming at least one copper contact in the metal containing layer; the copper contact comprising at least one selected from the group consisting of a copper connection, a copper pad, a copper plug, and a copper bit line.

5. The method of claim 1, the depositing the polymer material in a lower portion of the via comprising:
   converting at least a portion of the exposed metal containing layer to a metal sulfide and at least one selected from the group consisting of selective polymer growth by CVD, spin-on polymer solution and bake, and polymer growth by application of a monomers solution.

6. The method of claim 1, the polymer material comprising polyphenol acetylene, poly-acetylene, poly-diphenyl acetylene, polyaniline, polythiophene, polyporphyrins, porphyrinic macrocycles, thiol derivatized polyporphyrins, poly-metallocenes, polyferrocenes, polyphthalocyanines, polyvinylenes, polypyrroles, and poly-(p-phenylene vinylene), and/or combinations thereof, and/or monomers thereof.

7. The method of claim 1, the top electrode material layer comprising a conductive material.

8. The method of claim 1 further comprising:
   forming a word line over at least the electrode cap.

9. The method of claim 1 further comprising:
   forming a barrier metal layer immediately over at least the electrode cap.

10. The method of claim 1 further comprising:
    forming at least one selected from the group consisting of plugs, shallow trench isolation regions, and channel stop regions in one or more intermediate layers between the substrate and metal-containing layer and below the polymer material in the via in part by etching and removing at least one portion of at least one of the intermediate layers before forming the polymer material in the via.

11. The method of claim 1, the top electrode material layer comprising at least one selected from the group consisting of tungsten (W), titanium (Ti), tantalum (Ta), titanium nitride (TiN), tantalum nitride (TaN), amorphous carbon, aluminum, indium-tin oxide, platinum, zinc, nickel, iron, manganese, magnesium, gold, chromium, metal silicides, and alloys thereof, and/or any combination thereof.

12. The method of claim 11, the alloys comprising at least one selected from the group consisting of brass, stainless steel, magnesium-silver alloy, and combinations thereof.

13. A method of fabricating a polymer memory device in a via comprising:
    providing a semiconductor substrate having at least a first dielectric layer thereon;
    creating at least one selected from the group consisting of a copper bit line and a copper pad in the first dielectric layer;
    depositing at least a second dielectric layer over the copper bit line and/or the copper pad;
    creating at least one via in the second dielectric layer to expose at least a portion of the at least one copper bit line and copper pad;
    depositing a polymer material in a lower portion of the via;
    forming a top electrode material layer on the dielectric layer and the polymer material;
    etching the top electrode material layer to form an electrode cap on the polymer material in the via; and
    creating a word line over at least the electrode cap.

14. The method of claim 13, the dielectric layer comprising at least one selected from the group consisting of oxide, nitride, TEOS, FTEOS, and organic materials.

15. The method of claim 13, the depositing the polymer material in a lower portion of the via comprising:
    converting at least a portion of the exposed metal containing layer to a metal sulfide and at least one selected from the group consisting of selective polymer growth by CVD, spin-on polymer solution and bake, and polymer growth by application of a monomers solution.

16. The method of claim 13, the polymer material comprising polyphenol acetylene, poly-acetylene, poly-diphenyl acetylene, polyaniline, polythiophene, polyporphyrins, porphyrinic macrocycles, thiol derivatized polyporphyrins, poly-metallocenes, polyferrocenes, polyphthalocyanines, polyvinylenes, polypyrroles, and poly-(p-phenylene vinylene), and/or combinations thereof, and/or monomers thereof.

17. The method of claim 13, the top electrode material layer comprising at least one selected from the group consisting of tungsten (W), titanium (Ti), tantalum (Ta), titanium nitride (TiN), tantalum nitride (TaN), amorphous carbon, aluminum, indium-tin oxide, platinum, zinc, nickel, iron, manganese, magnesium, gold, chromium, metal silicides, and alloys thereof, and/or any combination thereof.

* * * * *